(12) United States Patent
Munakata et al.

(10) Patent No.: US 11,630,160 B2
(45) Date of Patent: Apr. 18, 2023

(54) BATTERY RESIDUAL VALUE DISPLAY DEVICE

(71) Applicant: Toyo System Co., Ltd., Fukushima (JP)

(72) Inventors: Ichiro Munakata, Fukushima (JP); Toshiaki Kanari, Fukushima (JP); Masahiro Shoji, Fukushima (JP); Katsunari Matsumoto, Fukushima (JP); Ryo Ishigami, Fukushima (JP); Takanori Anrui, Fukushima (JP); Misaki Shimoyamada, Fukushima (JP); Hideki Shoji, Fukushima (JP)

(73) Assignee: TOYO SYSTEM CO., LTD., Fukushima (JP)

(*) Notice: Subject to any disclaimer, the term of this patent is extended or adjusted under 35 U.S.C. 154(b) by 46 days.

(21) Appl. No.: 17/258,228

(22) PCT Filed: Jan. 29, 2020

(86) PCT No.: PCT/JP2020/003244
§ 371 (c)(1),
(2) Date: Jan. 6, 2021

(87) PCT Pub. No.: WO2020/202751
PCT Pub. Date: Oct. 8, 2020

(65) Prior Publication Data
US 2022/0352566 A1 Nov. 3, 2022

(30) Foreign Application Priority Data
Apr. 2, 2019 (JP) .............................. JP2019-070855

(51) Int. Cl.
*G01R 31/392* (2019.01)
*G01R 31/36* (2020.01)
(Continued)

(52) U.S. Cl.
CPC ......... *G01R 31/392* (2019.01); *G01R 31/367* (2019.01); *G01R 31/3646* (2019.01);
(Continued)

(58) Field of Classification Search
CPC .......................... G01R 31/3646; G01R 31/392
See application file for complete search history.

(56) References Cited

U.S. PATENT DOCUMENTS 5,606,243 A * 2/1997 Sakai ................. G01R 31/3648
320/152
2007/0029974 A1 2/2007 Uchida
(Continued)

FOREIGN PATENT DOCUMENTS

CN 108845270 A 11/2018
EP 2290387 A2 3/2011
(Continued)

OTHER PUBLICATIONS

International Search Report for PCT/JP2020/003244 dated Apr. 21, 2020 (6 pages).
(Continued)

*Primary Examiner* — Ricky Go
(74) *Attorney, Agent, or Firm* — Holtz, Holtz & Volek PC

(57) ABSTRACT

The battery residual value display device includes: a battery information receiving module; an attenuation function determining module; a second residual value determining module; a graph output module configured to output a graph of which one axis indicates residual values of a battery and another axis indicates information on an elapsed time from a time of manufacture of the battery; and a display unit. The graph output module is configured to output: in the graph, a display indicating a first residual value; a display indicating boundaries between a plurality of residual value ranks obtained by dividing the residual values in accordance with
(Continued)

a level of a second residual value; and a display indicating boundaries between a plurality of groups, indicating types of applications in which the battery can be used, obtained by dividing the plurality of residual value ranks in accordance with the level of the second residual value.

4 Claims, 4 Drawing Sheets

(51) Int. Cl.
G01R 31/367 (2019.01)
H01M 10/48 (2006.01)
(52) U.S. Cl.
CPC ..... *G01R 31/3647* (2019.01); *G01R 31/3648* (2013.01); *H01M 10/48* (2013.01)

(56) References Cited

U.S. PATENT DOCUMENTS

| | | | | |
|---|---|---|---|---|
| 2008/0150477 A1* | 6/2008 | Nakashima | ....... | H01M 10/4257 320/107 |
| 2008/0204031 A1* | 8/2008 | Iwane | .................. | G01R 31/389 324/430 |
| 2011/0050239 A1* | 3/2011 | Hoshino | ................ | G06Q 30/06 324/435 |
| 2012/0185190 A1* | 7/2012 | Okumura | ............. | G01R 31/367 702/63 |
| 2014/0214349 A1* | 7/2014 | Dong | ................... | G01R 31/392 702/63 |
| 2016/0223617 A1* | 8/2016 | Tao | ....................... | G01R 31/392 |
| 2020/0191873 A1* | 6/2020 | Yoshida | ............... | G01R 31/367 |
| 2021/0334860 A1 | 10/2021 | Liu et al. | | |

FOREIGN PATENT DOCUMENTS

| | | |
|---|---|---|
| JP | 2006197765 A | 7/2006 |
| JP | 2011091026 A | 5/2011 |
| JP | 2013169036 A | 8/2013 |
| JP | 2015021934 A | 2/2015 |
| JP | 2018029430 A | 2/2018 |
| JP | 2018137109 A | 8/2018 |
| WO | 2016194082 A1 | 12/2016 |
| WO | 2017038387 A1 | 3/2017 |

OTHER PUBLICATIONS

Extended European Search Report (EESR) dated Dec. 20, 2022, issued in counterpart European Application No. 20781294.2.

\* cited by examiner

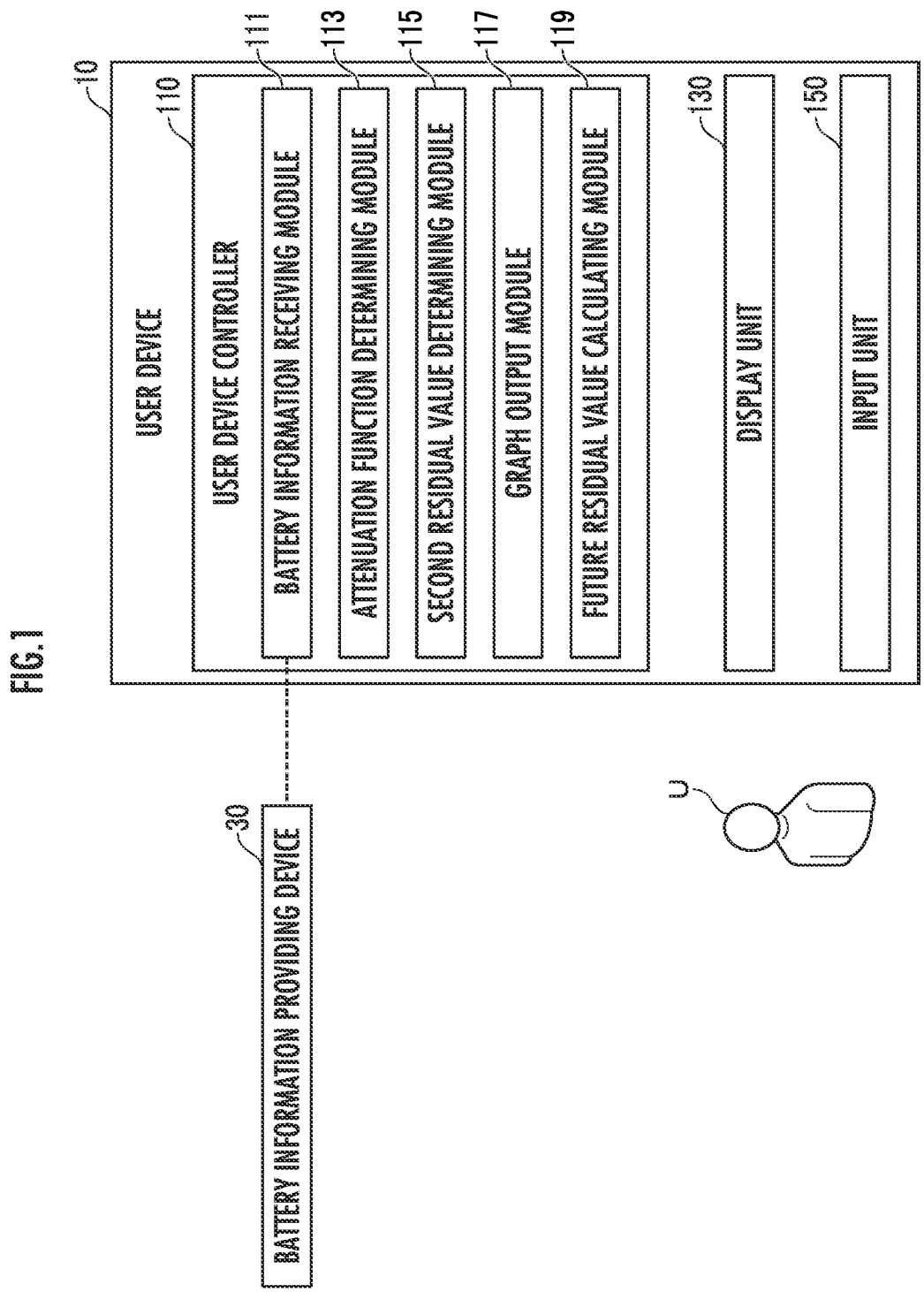

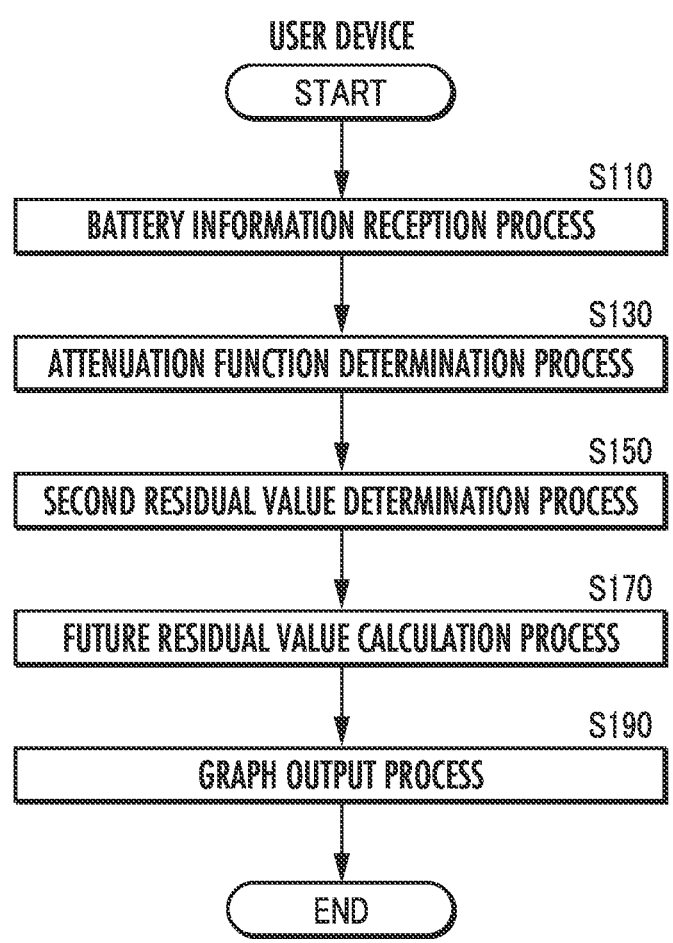

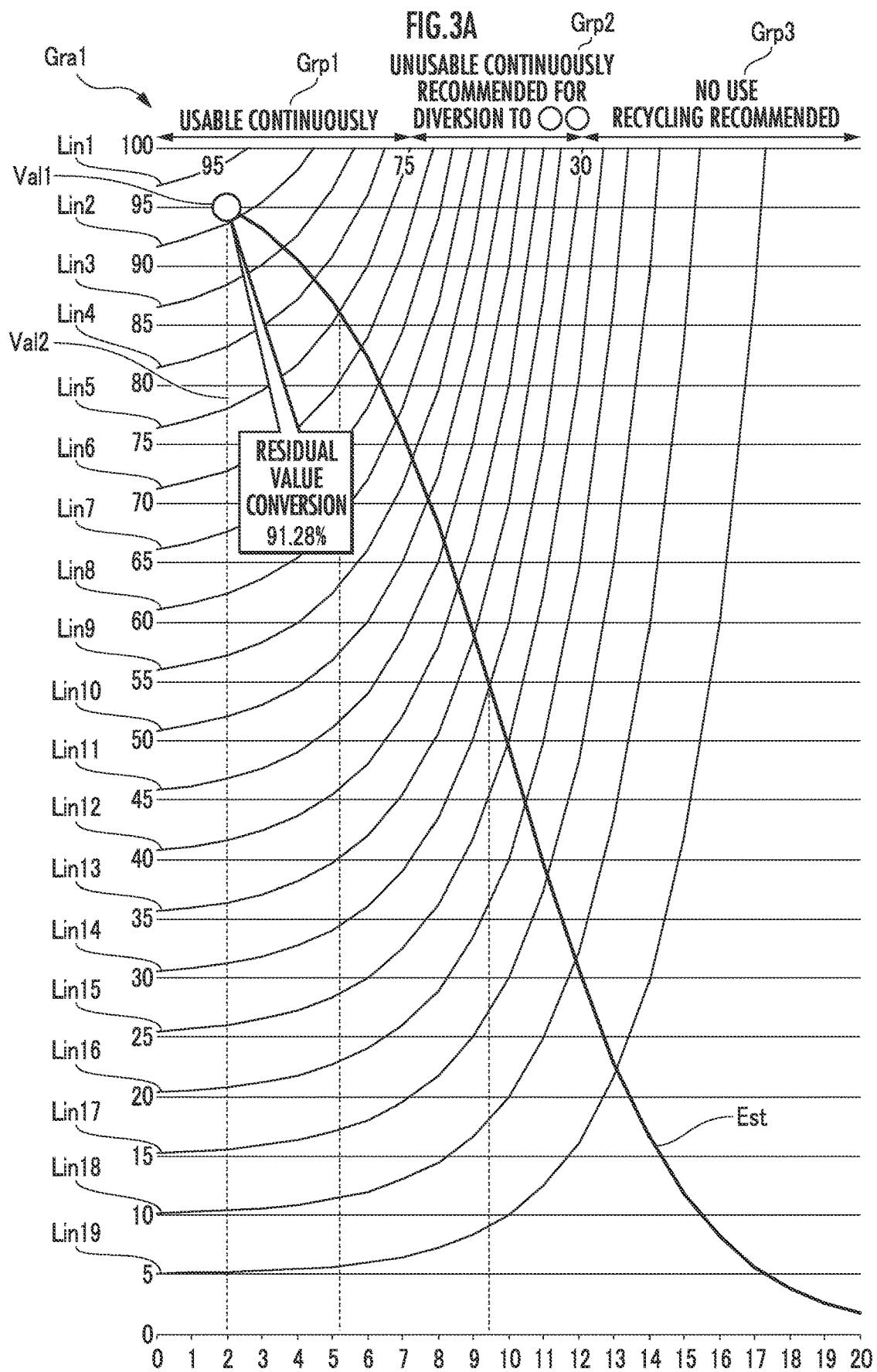

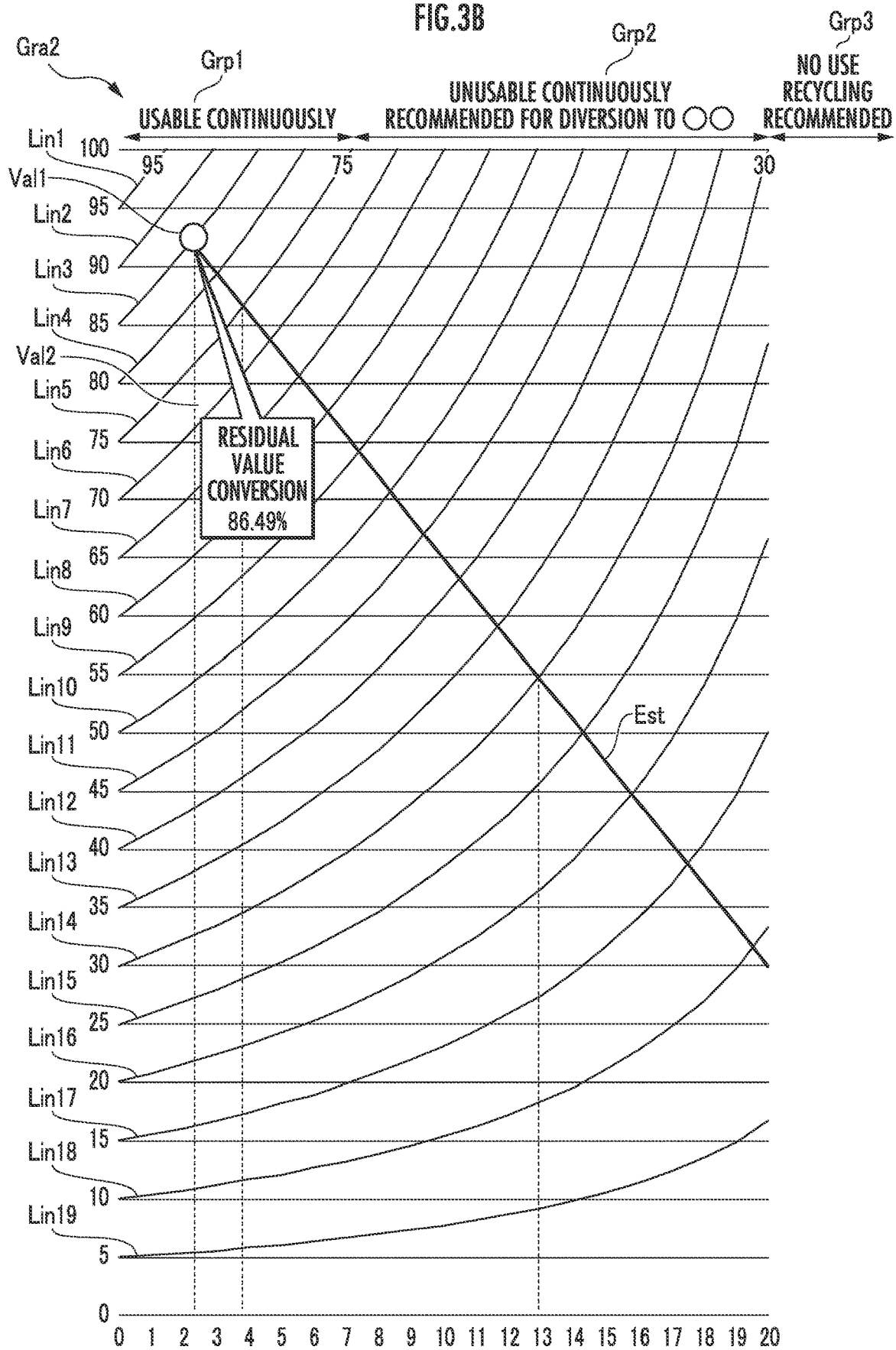

BATTERY RESIDUAL VALUE DISPLAY DEVICE

CROSS-REFERENCE TO RELATED APPLICATIONS

This patent application is a U.S. National Stage filing of, and claims priority to and all advantages of, PCT Patent Publication Number PCT/JP2020/003244 filed on Jan. 29, 2020 and Japanese Patent Application No. 2019-070855 filed on Apr. 2, 2019, the contents of both of which are incorporated herein by reference in their entireties.

TECHNICAL FIELD

The present invention relates to a device that displays a residual value of a battery.

BACKGROUND ART

A system that determines residual values of an electric vehicle and a hybrid vehicle is conventionally known (e.g., see Patent Literature 1).

The system according to Patent Literature 1 can determine a residual value of a secondary battery based on deterioration parameters of the battery for determining the residual values of the electric vehicle and the hybrid vehicle.

CITATION LIST

Patent Literature

Patent Literature 1: Japanese Patent Application Laid-Open No. 2006-197765

SUMMARY OF INVENTION

Technical Problem

Because a residual value of a driving battery is an important factor in determining the residual values of the electric vehicle and the hybrid vehicle, it is strongly desired that a user be informed of an accurate residual value of the battery in an easy-to-understand manner.

However, the system of Patent Literature 1 determines the residual value of the secondary battery based on deterioration parameters, but does not consider to display the determined residual value to the user in an easy-to-understand manner.

Consequently, the system of Patent Document 1 cannot inform the user of the determined residual value in an easy-to-understand manner.

In view of the problem of the conventional technology, the object of the present invention is to provide a battery residual value display device that can display an accurate residual value of a battery to a user in an easy-to-understand manner.

Solution to Problem

A battery residual value display device according to the present invention includes: a battery information receiving module configured to receive a first residual value indicating a state of health (SOH) of a battery that is a display target of a residual value, information on an elapsed time from a time of manufacture of the battery, and information on a service life of the battery; an attenuation function determining module configured to determine, by using the information on the elapsed time from the time of manufacture of the battery and the information on the service life of the battery received by the battery information receiving module and an attenuation function indicating a time-dependent change of SOH specific to the battery, an attenuation coefficient that is used for correction of the first residual value of the battery; a second residual value determining module configured to correct the first residual value by using the attenuation coefficient to determine a second residual value; a graph output module configured to output a graph of which one axis indicates residual values of the battery and another axis indicates the information on the elapsed time from the time of manufacture of the battery; and a display unit configured to display the graph output from the graph output module. The graph output module is configured to output: in the graph, a display indicating the first residual value of the battery; a display indicating boundaries between a plurality of residual value ranks obtained by dividing the residual values of the battery in accordance with a level of the second residual value; and a display indicating boundaries between a plurality of groups, indicating types of applications in which the battery can be used, obtained by dividing the plurality of residual value ranks in accordance with the level of the second residual value.

Even if the values of SOH (State Of Health) of a battery that is a display target of a residual value are the same, depending on the length of an elapsed time from manufacturing of the battery to the time of measurement, a deterioration rate of the battery after that is greatly different, and consequently the residual value of the battery is greatly different. For that reason, it is necessary to consider the age of the battery, for example, an elapsed time from the time of manufacture of the battery in order to inform a user of the accurate residual value of the battery.

In the battery residual value display device according to the present invention, the first residual value indicating the SOH of the battery that is a display target of the residual value, the information on the elapsed time from the time of manufacture of the battery, and the information on the service life of the battery are received by the battery information receiving module.

Then, by using the information on the elapsed time from the time of manufacture of the battery and the information on the service life of the battery received by the battery information receiving module and an attenuation function indicating a time-dependent change of SOH specific to the battery, the attenuation coefficient that is used for correction of the first residual value of the battery is determined by the attenuation function determining module.

Then, the first residual value is corrected by using the attenuation coefficient to determine the second residual value by the second residual value determining module.

As a result, the user can know the accurate residual value of the battery in consideration of the age of the battery.

Moreover, the graph of which one axis indicates the residual values of the battery and another axis indicates the information on the elapsed time from the time of manufacture of the battery is output by the graph output module and is displayed on the display unit.

In addition, a display indicating the first residual value of the battery, a display indicating boundaries between a plurality of residual value ranks obtained by dividing the residual values of the battery in accordance with a level of the second residual value, and a display indicating boundaries between a plurality of groups, indicating types of applications in which the battery can be used, obtained by dividing the plurality of residual value ranks in accordance with the level of the second residual value are output in the graph by the graph output module.

As a result, because the accurate residual value of the battery is visualized and displayed, the user can be intuitively informed of the accurate residual value of the battery.

As described above, according to the present invention, it is possible to display the accurate residual value of the battery to the user in an easy-to-understand manner.

In the battery residual value display device according to the present invention, the graph output module is preferably configured to divide the plurality of groups indicating the types of applications into at least a first group indicating that the battery can continue to be used in a current application thereof, a second group indicating that the battery cannot be used in the current application but has another application, and a third group indicating that the battery cannot be used in the current application and does not have the other application.

In the battery residual value display device according to the present invention, the plurality of groups indicating the types of applications are divided and output by the graph output module into at least the first group indicating that the battery can continue to be used in a current application thereof, the second group indicating that the battery cannot be used in the current application but has another application, and the third group indicating that the battery cannot be used in the current application and does not have the other application As a result, the user of the battery residual value display device according to the present invention can be informed of whether the battery that is a display target of the residual value can continue to be used in the current application or can be used in a method other than discarding in an easy-to-understand manner.

As described above, according to the present invention, the residual value of the battery and the corresponding application of the battery can be displayed to the user in an easy-to-understand manner.

In the battery residual value display device according to the present invention, the device preferably includes a future residual value calculating module configured to calculate predicted values of the first residual value of the battery at multiple time points in future by using the first residual value and the attenuation function of the battery, and the graph output module is preferably configured to output in the graph a display indicating the predicted values of the first residual value calculated by the future residual value calculating module at the multiple time points in the future.

In the battery residual value display device according to the present invention, the predicted values of the first residual value of the battery at the multiple time points in the future are calculated by the future residual value calculating module by using the first residual value and the attenuation coefficient of the battery.

Then, a display indicating the predicted values of the first residual value calculated by the future residual value calculating module at the multiple time points in the future are output by the graph output module in the graph.

As a result, the user can intuitively know the current and future residual values of the battery.

As described above, according to the present invention, the current and future residual values of the battery can be displayed to the user in an easy-to-understand manner.

BRIEF DESCRIPTION OF DRAWINGS

FIG. 1 is a block diagram illustrating an entire configuration of a battery residual value display device.

FIG. 2 is a flowchart illustrating the contents of processing by the battery residual value display device.

FIG. 3A is a diagram illustrating an example of the output contents of the battery residual value display device.

FIG. 3B is a diagram illustrating another example of the output contents of the battery residual value display device.

DESCRIPTION OF EMBODIMENTS

A battery residual value display device according to the present embodiment will be described with reference to the drawings. Herein, the same components may be designated by the same reference numbers and descriptions thereof may be omitted.

First, a configuration of the battery residual value display device according to the present embodiment will be described with reference to FIG. 1. The battery residual value display device according to the present embodiment is configured by a user device 10.

The user device 10 is, for example, a computer that includes a user device controller 110, a display unit 130, and an input unit 150. The user device 10 may be a dedicated terminal used for displaying the residual value of a battery, or may be a general-purpose device such as a personal computer, a smartphone, and a tablet terminal.

The user device controller 110 is configured to include "an arithmetic processing unit such as a central processing unit (CPU)", a memory, an input/output (I/O) unit, and the like. The user device controller 110 functions as a battery information receiving module 111, an attenuation function determining module 113, a second residual value determining module 115, a graph output module 117, and a future residual value calculating module 119, by reading and executing a predetermined program.

The battery information receiving module 111 receives: a first residual value indicating a state of health (SOH) of a battery that is a display target of a residual value; information on an elapsed time from the time of manufacture of the battery; and information on the service life of the battery, from a battery information providing device 30, for example.

Any mechanism that acquires information for determining SOH of a battery from the battery, determines the SOH of the battery based on the information, and provides to the battery information receiving module 111 the determined SOH, the information on the elapsed time from the time of manufacture of the battery, and the information on the service life of the battery can be used as the battery information providing device 30.

Based on the information on the elapsed time from the time of manufacture of the battery and the information on the service life of the battery received by the battery information receiving module 111, the attenuation function determining module 113 determines an attenuation function that is used for correction of the first residual value of the battery and indicates a time-dependent change of the SOH specific to the battery.

The second residual value determining module 115 corrects the first residual value by using the attenuation function to determine the second residual value.

The graph output module 117 outputs a graph of which one axis indicates the residual values of the battery and another axis indicates the information on the elapsed time from the time of manufacture of the battery.

The future residual value calculating module 119 calculates predicted values of the first residual value of the battery at the multiple time points in the future by using the first residual value and the attenuation coefficient of the battery.

The display unit 130 displays the graph output from the graph output module 117.

The input unit 150 is, for example, a switch, a button, a touch panel, a keyboard and a mouse, or a microphone, which accepts the input of an operation that is performed onto the user device 10 by a user U.

Outline of Processing of Battery Residual Value Display Device

Next, an example of the outline of processing of the battery residual value display device will be described with reference to FIG. 2.

First, a battery information reception process for receiving: the voltage, current, and temperature of a battery that is a determination target of a residual value; information on an elapsed time from the time of manufacture of the battery; and information on the service life of the battery is executed in accordance with an operation of the user U (S110 in FIG. 2).

Next, an attenuation function determination process for determining an attenuation function, which is used for correction of a first residual value of the battery and indicates a time-dependent change of SOH specific to the battery, is executed based on the information on the elapsed time from the time of manufacture of the battery and the information on the service life of the battery received by the battery information receiving module 111 (S130 in FIG. 2).

Next, a second residual value determination process for correcting the first residual value by using the attenuation function to determine a second residual value is executed (S150 in FIG. 2).

Next, a future residual value calculation process for calculating predicted values of the first residual value of the battery at multiple time points in the future by using the first residual value and the attenuation coefficient of the battery is executed if needed (S170 in FIG. 2).

Then, a graph output process for outputting to the display unit 130 a graph of which one axis indicates the residual values of the battery and another axis indicates the information on the elapsed time from the time of manufacture of the battery is executed (S190 in FIG. 2), and a series of processes by the battery residual value display device is terminated.

Next, the contents of each process will be described with reference to FIGS. 3A and 3B.

<Battery Information Reception Process>

The user device 10 is activated in accordance with an operation of the user U, and in a state where the user device 10 and the battery information providing device 30 are connected to each other, for example, a battery information reception process is started by performing an operation to start the battery information reception process.

When the battery information reception process is started, the battery information receiving module 111 receives a first residual value indicating SOH of a battery that is a display target of the residual value, information on an elapsed time from the time of manufacture of the battery, and information on the service life of the battery from the battery information providing device 30, and terminates the process.

<Attenuation Function Determination Process>

An attenuation function determination process is started by, for example, the termination of the battery information reception process.

When the attenuation function determination process is started, the attenuation function determining module 113 determines an attenuation function, which is used for correction of the first residual value of the battery and indicates a time-dependent change of the SOH specific to the battery, based on the information on the elapsed time from the time of manufacture of the battery and the information on the service life of the battery received by the battery information receiving module 111.

At this time, if the attenuation function determined by the attenuation function determining module 113 is a function that indicates the time-dependent change of the SOH specific to the battery, the attenuation function may employ: a first-order expression or a multi-order expression of which variables are the information on the elapsed time from the time of manufacture of the battery and the information on the service life of the battery; a function that further uses other variables; or various methods such as a model and an approximate expression that are obtained by analyzing a correlation between the SOH and the information on the elapsed time from the time of manufacture of the battery and the service life of the battery. However, the attenuation function of the present embodiment is represented by the following sigmoid function expression, for example.

$$y = \frac{1}{1 + e^{a(x-b)}} \quad (1)$$

Herein, "y" is an attenuation coefficient of the battery, "a" is a constant, "b" is a value that indicates a service life of the battery, "e" is the number of Napier, and "x" is a value that indicates the elapsed time from the time of manufacture of the battery in years.

The attenuation function determining module 113 acquires a constant a previously stored in the user device 10, for example, and determines the attenuation function by using: the acquired constant a; a value indicating the service life of the battery included in the information received from the battery information providing device 30 by the battery information receiving module 111; and a value obtained by converting into years the information indicating the elapsed time from the time of manufacture of the battery received from the battery information providing device 30 by the battery information receiving module 111.

Then, the attenuation function determining module 113 determines an attenuation coefficient y by using Expression (1) and terminates the process.

The amount of future maintenance costs of the battery is an important factor in determining the residual value of the battery. Then, when the battery breaks down after the end of its service life, the owner of the battery cannot take the manufacturer's warranty and thus bears a maintenance cost. For that reason, the elapsed time from the time of manufacture of the battery and the service life of the battery, which is the determination target of the residual value, are an important factor when the residual value of the battery is accurately determined.

The residual value of the battery does not necessarily decrease linearly in accordance with the elapsed time from the time of manufacture Immediately after sale, namely, after a slight drop at the timing of getting out of the new state, the residual value gently decreases at a certain initial stage that is still as good as new, and then rapidly decreases toward a service life in which free repairs by the manufacturer cannot be received.

Then, the residual value of the battery continues to decrease suddenly after the passage of the service life. On the other hand, because rare metal etc. included in the battery can be recycled even if the battery cannot be eventually used as a battery, the rate of decrease in the residual value of the battery decreases gradually in the final phase of a battery lifetime because the residual value is not lost.

In other words, the residual value of the battery slowly decreases at an early stage and then suddenly decreases, but in the final phase of its lifetime, it is more realistic that the residual value changes while drawing a curve that continues to maintain a certain degree of residual value.

In the present embodiment, the curve of the time-dependent change in the residual value of the battery as described above can be easily approximated because Expression (1) is used as the attenuation function.

<Second Residual Value Determination Process>

A second residual value determination process is started by the termination of the attenuation function determination process.

When the second residual value determination process is started, the second residual value determining module 115 determines, as a second residual value of the battery, a value obtained by multiplying the attenuation coefficient y determined in the attenuation function determination process by the first residual value of the battery received by the battery information receiving module 111, and terminates the process.

As a result, the user U can know the accurate residual value of the battery in consideration of the age of the battery.

<Future Residual Value Calculation Process>

A future residual value calculation process is started if needed after the termination of the second residual value determination process.

When the future residual value calculation process is started, the future residual value calculating module 119 calculates predicted values of the first residual value of the battery at the multiple time points in the future by using the first residual value and the attenuation coefficient of the battery, and terminates the process.

As a result, the user U of the battery residual value display device according to the present invention can be informed of estimated results of change in a future residual value of the battery that is the determination target of the residual value in an easy-to-understand manner.

More specifically, the case where the constant a of Equation (1) is 0.4, the value b indicating the service life of the battery is 10 (years), the elapsed time from the time of manufacture of the battery at the time of processing is 2 (years), and the first residual value of the battery received by the battery information receiving module 111 is 0.9500 will be described below.

In this case, the calculation result by Expression (1) is 0.9608 when the calculation result is calculated to the fourth decimal place. However, because the first residual value of the battery received by the battery information receiving module 111 is 0.9500, the future residual value calculating module 119 calculates the predicted values of the first residual value of the battery at the multiple time points in the future considering that the decrease in the SOH of the battery is about 0.0108 ahead of the calculated theoretical value.

In other words, for example, the future residual value calculating module 119 calculates, to be 0.9427, the estimated value of the first residual value of the third-year battery to the fourth decimal place by Expression (1). However, in consideration of a difference between the first residual value (0.9500) of the battery received by the battery information receiving module 111 and the calculated theoretical value (0.9608) of the SOH of the battery, this value is calculated as the estimated value of the first residual value of the third-year battery=0.9427*(0.9500/0.9608)=0.9320, for example.

Then, the future residual value calculating module 119 calculates, from the fourth year, the predicted values of the first residual value up to twice the service life (up to the 20th year in the embodiment) for example <Graph Output Process>

A graph output process is started by the termination of the second residual value output process, or by the termination of the future residual value calculation process when the future residual value calculation process is executed.

When the graph output process is started, the graph output module 117 outputs information indicating a graph of which a vertical axis indicates residual values of the battery that is a display target of the residual value and a horizontal axis indicates the information on the elapsed time from the time of manufacture of the battery, and terminates the process.

In addition, the graph output module 117 outputs: in the graph, a display indicating the first residual value of the battery; a display indicating boundaries between a plurality of residual value ranks obtained by dividing the residual values of the battery in accordance with a level of the second residual value; and a display indicating boundaries between a plurality of groups, indicating types of applications in which the battery can be used, obtained by dividing the plurality of residual value ranks in accordance with the level of the second residual value.

As a result, because the accurate residual value of the battery is visualized and displayed, the user can be intuitively informed of the accurate residual value of the battery.

At this time, as the plurality of groups indicating the types of applications, the graph output module 117 outputs in the graph a display indicating boundaries between groups that are divided into at least a first group indicating that the battery can continue to be used in a current application thereof, a second group indicating that the battery cannot be used in the current application but has another application, and a third group indicating that the battery cannot be used in the current application and does not have the other application.

As a result, the user U of the battery residual value display device according to the present invention can be informed of whether the battery that is a display target of the residual value can continue to be used in the current application or can be used in a method other than discarding in an easy-to-understand manner.

The graph output module 117 displays a graph Gra1 as illustrated in FIG. 3A on the display unit 130, for example.

FIG. 3A illustrates the graph Gra1 of which the vertical axis indicates, in a unit of %, the first residual values of the battery that is a display target of the residual value and the horizontal axis indicates, in units of years, values of the elapsed time from the time of manufacture of the battery (hereinafter, "elapsed time").

The graph Gra1 includes border lines Lin1, Lin2, . . . , and Lin19 that are displays indicating boundaries between residual value ranks divided into 100% to 95%, less than 95% to 90%, and so on in 5% increments in accordance with the value of the second residual value of the battery.

For example, because a value obtained by correcting the first residual value of the battery to the second residual value is the residual value rank of 100% to 95% in the border line Lin1, the border line Lin1 indicates a boundary of what percentage or more the value of the first residual value should be in each elapsed time.

More specifically, when the elapsed time is 1 year, a value of the first residual value at the boundary of the border line Lin1 is 92.47%. This value is a value obtained by multiplying the attenuation coefficient (0.9734) when the elapsed time is 1 year by 95%.

Similarly, a value of the first residual value at the boundary of the border line Lin1 in each case where the elapsed period is 2 years or more is calculated in the graph output process, and the border line Lin1 that connects the values in these elapsed times is included in the graph Gra1.

The border lines Lin2, . . . , and Lin19 that are calculated in such a similar method are included in the graph Gra1 as displays that indicate boundaries between residual value ranks.

Moreover, a display Val1 indicating the first residual value of the battery that is the determination target of a residual value is included in the graph Gra1. In the present embodiment, the display Val1 indicates that a duration of service is 2 years and the first residual value is 95% in a unit of %.

Moreover, the graph Gra1 includes displays Grp1, Grp2, and Grp3 that indicate boundaries between three groups, indicating types of applications in which the battery that is the determination target of the residual value can be used, obtained by dividing the residual value ranks in accordance with the level of the second residual value.

In the present embodiment, the display Grp1 indicates a range included in the first group that indicates that the battery can continue to be used in the current application thereof. A battery of which the second residual value is 75% or more is included in this range.

The display Grp2 indicates a range included in the second group that indicates that the battery cannot be used in the current application but has another application. A battery of which the second residual value is less than 75% and not less than 30% is included in this range.

The display Grp3 indicates a range included in the third group that indicates that the battery cannot be used in the current application and does not have the other application. A battery of which the second residual value is less than 30% is included in this range.

Moreover, the graph Gra1 includes a display Est indicating first residual values at multiple time points in the future of the battery that is the determination target of a residual value, which are estimated by the future residual value calculating module 119.

Furthermore, as illustrated in FIG. 3A, a display Val2 indicating the second residual value of the battery at the time of processing may be included in the graph Gra1.

FIG. 3B illustrates the content of a graph Gra2 when the attenuation function determining module 113 is configured to determine an attenuation coefficient by using Equation (2) as an attenuation function instead of Expression (1).

$$y = 1 - x \cdot (1-c)/2b( \qquad 2)$$

Herein, "y" is an attenuation coefficient of a battery, "b" is a value indicated by a service life of the battery, "c" is a value indicating a residual rate of the first residual value after a period of twice the service life of the battery has elapsed, and "x" is a value indicating an elapsed time from the time of manufacture of the battery. In FIG. 3B, calculation is performed assuming that "b" is 10 (years) and "c" is 30%.

As described above, the present invention can provide the battery residual value display device that can display the accurate residual value of the battery to the user in an easy-to-understand manner.

As described above, the embodiment of the present invention has been described, but the present invention is not limited to this embodiment. Various modifications can be made without departing from the spirit of the present invention.

For example, as described above, there has been described the configuration in which the battery information receiving module 111 receives, from the battery information providing device 30, the first residual value indicating the SOH of the battery that is a display target of the residual value, the information on the elapsed time from the time of manufacture of the battery, and the information on the service life of the battery. However, the present invention is not limited to this.

For example, the battery information receiving module 111 may be configured to receive, via the input unit 150, the first residual value indicating the SOH of the battery that is a display target of the residual value by the operation of the user U himself, the information on the elapsed time from the time of manufacture of the battery, and the information on the service life of the battery.

Moreover, as described above, there has been described the configuration in which the graph output module 117 displays by a curve the boundaries between the plurality of residual value ranks obtained by dividing the residual values of the battery in accordance with the level of the second residual value. However, the present invention is not limited to this.

For example, the graph output module 117 may be configured to display the boundaries between the plurality of residual value ranks obtained by dividing the residual values of the battery in accordance with the level of the second residual value by outputting areas indicating residual value ranks adjacent to each other in different colors, patterns, and brightness.

Moreover, as described above, there has been described the configuration in which the graph output module 117 displays in the graph a value of the second residual value of the battery at the time of processing in a unit of %. However, the present invention is not limited to this.

For example, the graph output module 117 may be configured to display in the graph a letter (A rank etc. in case of 100% to 95%) indicating a rank corresponding to the second residual value, a number (4 of 5 stages in case of less than 95% and 90% or more), or another symbol, in addition to or in place of displaying the value of the second residual value in a unit of %.

DESCRIPTION OF REFERENCE NUMERALS

10 . . . User device, 111 . . . Battery information receiving module, 113 . . . Attenuation function determining module, 115 . . . Second residual value determining module, 117 . . . Graph output module, 119 . . . Future residual value calculating module, 130 . . . Display unit.

The invention claimed is:

1. A battery residual value display device comprising:
a battery information receiving module configured to receive a first residual value indicating a state of health (SOH) of a battery that is a display target of a residual value, information on an elapsed time from a time of manufacture of the battery, and information on a service life of the battery;
an attenuation function determining module configured to determine, by using the information on the elapsed time from the time of manufacture of the battery and the information on the service life of the battery received by the battery information receiving module and an attenuation function indicating a time-dependent change of SOH specific to the battery, an attenuation coefficient that is used for correction of the first residual value of the battery;

a second residual value determining module configured to correct the first residual value by using the attenuation coefficient to determine a second residual value;

a graph output module configured to output a graph of which one axis indicates residual values of the battery and another axis indicates the information on the elapsed time from the time of manufacture of the battery; and a display unit configured to display the graph output from the graph output module, wherein the graph output module is configured to output:
in the graph, a display indicating the first residual value of the battery;
a display indicating boundaries between a plurality of residual value ranks obtained by dividing the residual values of the battery in accordance with a level of the second residual value; and
a display indicating boundaries between a plurality of groups, indicating types of applications in which the battery can be used, obtained by dividing the plurality of residual value ranks in accordance with the level of the second residual value.

2. The battery residual value display device according to claim 1, wherein the graph output module is configured to divide the plurality of groups indicating the types of applications into at least a first group indicating that the battery can continue to be used in a current application thereof, a second group indicating that the battery cannot be used in the current application but has another application, and a third group indicating that the battery cannot be used in the current application and does not have the another application.

3. The battery residual value display device according to claim 1, further comprising:
a future residual value calculating module configured to calculate predicted values of the first residual value of the battery at multiple time points in future by using the first residual value and the attenuation function of the battery, wherein the graph output module is configured to output in the graph a display indicating the predicted values of the first residual value calculated by the future residual value calculating module at the multiple time points in the future.

4. A battery residual value display method that is executed by a computer including a display unit, the method comprising:
a battery information reception step of receiving a first residual value indicating a state of health (SOH) of a battery that is a display target of a residual value, information on an elapsed time from a time of manufacture of the battery, and information on a service life of the battery;
an attenuation function determination step of determining, by using the information on the elapsed time from the time of manufacture of the battery and the information on the service life of the battery received in the battery information reception step and an attenuation function indicating a time-dependent change of SOH specific to the battery, an attenuation coefficient that is used for correction of the first residual value of the battery;
a second residual value determination step of correcting the first residual value by using the attenuation coefficient to determine a second residual value; and
a graph output step of outputting to the display unit a graph of which one axis indicates residual values of the battery and another axis indicates the information on the elapsed time from the time of manufacture of the battery, wherein the graph output step includes outputting:
in the graph, a display indicating the first residual value of the battery;
a display indicating boundaries between a plurality of residual value ranks obtained by dividing the residual values of the battery in accordance with a level of the second residual value; and
a display indicating boundaries between a plurality of groups, indicating types of applications in which the battery can be used, obtained by dividing the plurality of residual value ranks in accordance with the level of the second residual value.

* * * * *